United States Patent [19]

Inoue et al.

[11] Patent Number: 6,140,738

[45] Date of Patent: *Oct. 31, 2000

[54] SURFACE ACOUSTIC WAVE DEVICE

[75] Inventors: Kenji Inoue; Katsuo Sato, both of Chiba, Japan

[73] Assignee: TDK Corporation, Tokyo, Japan

[*] Notice: This patent is subject to a terminal disclaimer.

[21] Appl. No.: 09/394,718

[22] Filed: Sep. 13, 1999

Related U.S. Application Data

[63] Continuation of application No. 08/824,091, Mar. 25, 1997.

[30] Foreign Application Priority Data

Jun. 21, 1996 [JP] Japan ................................. 8-181500

[51] Int. Cl.$^7$ .................................................. H01L 41/08
[52] U.S. Cl. ........................................................ 310/313 A
[58] Field of Search ........................... 310/313 A, 313 B, 310/313 R, 360

[56] References Cited

U.S. PATENT DOCUMENTS

| | | | |
|---|---|---|---|
| 5,557,968 | 9/1996 | Krempl et al. | 73/497 |
| 5,821,673 | 10/1998 | Pisareusky et al. | 310/313 A |
| 5,917,265 | 6/1999 | Naumenko et al. | 310/313 A |
| 6,005,325 | 12/1999 | Inoue et al. | 310/313 A |

FOREIGN PATENT DOCUMENTS

WO 97/25776  7/1997  WIPO .

OTHER PUBLICATIONS

1995 IEEE Ultrasonics Symposium, pp. 389–392, 1995, I. B. Yakovkin, et al., "Numerical And Experimental Investigation Saw In Langasite".

1993 IEEE International Frequency Control Symposium, pp. 348–350, 1993, I. N. Silvestrova, et al., "Present Stage Of $La_3Ga_5SiO_{14}$–Research".

1992 IEEE Ultrasonics Symposium, pp. 403–412, 1992, J. G. Gualtieri, et al., "Piezoelectoric Materials For Saw Applications".

1994 IEEE Transactions on Ultrasonics, Ferroelectrics, and Frequency Control, vol. 41, No. 1, pp. 53–59, Jan. 1, 1994, John G. Gualtieri, et al., "Piezoelectric Materials For Acoustic Wave Applications".

1994 IEEE International Frequency Control Symposium, pp. 48–57, 1994, B. Capelle, et al., "Study of Gallium Phosphate And Langasite Crystals And Resonators By X Ray Topography".

1994 IEEE International Frequency Control Symposium, pp. 58–71, 1994, J. Detaint, et al., "Bulk Wave Propagation And Energy Trapping In The New Thermally Compensated Materials With Trigonal Symmetry".

1994 IEEE International Frequency Control Symposium, pp. 43–47, 1994, M. F. Dubovik, et al., "Langasite ($La_3Ga_5SiO_{14}$) An Optical Piezoelectric; Growth And Properties".

(List continued on next page.)

*Primary Examiner*—Mark Budd
*Attorney, Agent, or Firm*—Oblon, Spivak, McClelland, Maier & Neustadt, P.C.

[57] ABSTRACT

In a surface acoustic wave device comprising an inter-digital electrode on a surface of a substrate wherein said substrate is a langasite single crystal belonging to a point group 32, a combination of a cut angle of the substrate out of the single crystal and a propagation direction of surface acoustic waves is optimized. This makes it possible to achieve a surface acoustic wave device comprising a substrate having a temperature coefficient of SAW velocity, TCV, the absolute value of which is small, a large electromechanical coupling factor $k^2$, and low SAW velocity. It is thus possible to achieve a filter device which is improved in terms of temperature stability, has a wide passband, and is reduced in size, especially an intermediate-frequency surface acoustic wave filter having improved characteristics best-fitted for mobile communication terminal equipment.

4 Claims, 1 Drawing Sheet

OTHER PUBLICATIONS

1995 IEEE Ultrasonics Symposium, pp. 409–412, 1995, K. S. Aleksandrov, et al., "Effects Of Static Electric Field And Of Mechanical Pressure On Surface Acoustic Waves Propagation In $La_3Ga_5SiO_{14}$ Piezolectric Single Crystals".

The $17^{th}$ Symposium Preprint on the Fundamentals and Applications of Ultrasonic Electronics, pp. 307–308, "A Study On Saw Propagation Characteristics On A Langasite Crystal Plate".

The 51th Study Meeting in the $150^{th}$ Committe of Surface Acoustic Wave Device Technology, The Japan Society for the Promotion of Science, pp. 21–27, Hiroaki Satoh, et al., "Propagation Direction Dependence Of Rayleigh Waves On A Langasite Crystal Plate".

The $17^{th}$ Symposium Preprint on the Fundamentals and Applications of Ultrasonic Electronics, pp. 305–306, Takashi Sato, et al., "Propagation Characteristics Of Surface Acoustic Waves On $La_3Ga_5SiO_{14}$".

Numerical and Experimental Investigation Saw in Langasite, Yakou Kin et al, 1993 IEEE Ultrasonics Symposium, pp. 389–392.

Effects of Static Electric Field and Mechanical Pressure on Surface Acoustic Waves Propagation in $La_3Ga_5SiO_{14}$, Piezoelectric Single Crystals, Aleksandrov et al., 1995 IEEE Ultrasonics Symposium, pp. 409–412.

SURFACE ACOUSTIC WAVE DEVICE

This appln is a con't of Ser. No. 08/824,091 filed Mar. 25, 1997.

BACKGROUND OF THE INVENTION

The present invention relates to a surface acoustic wave device comprising an interdigital electrode on a single crystal substrate.

In recent years, mobile communication terminal equipment inclusive of cellular telephones has been rapidly popularized. This terminal equipment is particularly desired to be reduced in size and weight for reason of portability. To achieve size and weight reductions for the terminal equipment, electronic parts used therewith, too, should be essentially reduced in size and weight. For this reason, surface acoustic wave devices favorable for size and weight reductions, i.e., surface acoustic wave filters are often used for high- and intermediate-frequency parts of the terminal equipment. A surface acoustic wave device has on a piezoelectric substrate an interdigital electrode for exciting, receiving, reflecting, and propagating surface acoustic waves.

Among characteristics important to a piezoelectric substrate used for surface acoustic wave devices, there are the surface wave velocity of surface acoustic waves (SAW velocity), the temperature coefficient of a center frequency in the case of filters and of a resonance frequency in the case of resonators (the temperature coefficient of frequency: TCF), and an electromechanical coupling factor ($k^2$). Set out in Table 1 are the characteristics of various piezoelectric substrate known so far for surface acoustic wave devices. Hereinafter, these piezoelectric substrates will be referred to by the symbols used in Table 1. In this regard, it is to be noted that TCV (the temperature coefficient of SAW velocity) is a quantity representing the temperature dependence of the velocity of surface acoustic waves (the SAW velocity); that is, it has a value equivalent to that of the aforesaid TCF representing the temperature dependence of the center or resonance frequency. A large TCV value implies that the center frequency of a surface acoustic wave filter varies significantly with temperature.

strates used but almost inversely proportional to the widths of electrode fingers formed on substrates. To enable such filters to be operated at high frequencies, therefore, it is preferable to resort to substrates having high SAW velocities, for instance, 64 LN, and 36 LT. Also, wide passband widths of 20 MHz or more are required for filters used on high-frequency parts. To achieve such wide passbands, however, it is essentially required that piezoelectric substrates have a large electromechanical coupling factor $k^2$. For these reasons, much use is made of 64 LN, and 36 LT.

On the other hand, a frequency band of 70 to 300 MHz is used as an intermediate frequency for mobile terminal equipment. When a filter using this frequency band as a center frequency is constructed with the use of a surface acoustic wave device, the use of the aforesaid 64 LN or 36 LT as a piezoelectric substrate causes the width of an electrode finger formed on the substrate to be much larger than that of the aforesaid filter used for a high-frequency part.

This will now be explained with reference to roughly calculated specific values. Here let d represent the width of an electrode finger of a surface acoustic wave transducer that forms a surface acoustic wave filter, $f_0$ indicate the center frequency of the surface acoustic wave filter, and V denote the SAW velocity of the piezoelectric substrate used. For these values, equation (1) then holds roughly $$f_0 = V/(4d) \qquad (1)$$

If a surface acoustic wave filter having a center frequency of 1 GHz is constructed on the assumption that the SAW velocity is 4,000 m/s, then the width of its electrode finger is calculated from equation (1) to be $$d = 4{,}000 \text{ (m/s)}/(4 \times 1{,}000 \text{ (MHz)}) = 1 \text{ } \mu m$$

On the other hand, when an intermediate-frequency filter having a center frequency of 100 MHz is constructed using this piezoelectric substrate having an SAW velocity of 4,000 m/s, the electrode finger width required for this is given by $$d = 4{,}000 \text{ (m/s)}/(4 \times 100 \text{ (MHz)}) = 10 \text{ } \mu m$$

TABLE 1

| Symbol | Composition | Cut Angle | Propagation Direction | SAW Velocity(m/s) | $k^2$(%) | TCV(ppm/° C.) |
|---|---|---|---|---|---|---|
| 128LN | LiNbO$_3$ | 128°-Rotation Y | X | 3992 | 5.5 | −74 |
| 64LN | LiNbO$_3$ | 64°-Rotation Y | X | 4742 | 11.3 | −79 |
| LT112 | LiTaO$_3$ | X | 112°-Rotation Y | 3288 | 0.64 | −18 |
| 36LT | LiTaO$_3$ | 36°-Rotation Y | X | 4212 | 4.7 | −45 |
| ST Quartz Crystal | Quartz Crystal | ST | X | 3158 | 0.14 | 0 (primary coef.) |
| BGO | Bi$_{12}$GeO$_{20}$ | (100) | (011) | 1681 | 1.2 | −122 |

As can be seen from Table 1, 64 LN and 36 LT have an SAW velocity of 4,000 m/s or higher, and so are suitable to construct filters for high-frequency parts of terminal equipment. Referring now to the reason for this, various systems are practically employed for mobile communications represented by cellular telephones all over the world, and are all used at frequencies of the order of 1 GHz. Accordingly, filters used for high-frequency parts of terminal equipment have a center frequency of approximately 1 GHz. Surface acoustic wave filters have a center frequency substantially proportional to the SAW velocities of piezoelectric sub- Thus, the required electrode finger width is 10 times as large as that for the high-frequency part filter. A large electrode finger width implies that a surface acoustic wave device itself becomes large. To make a surface acoustic wave intermediate-frequency filter small, therefore, it is necessary to use a piezoelectric substrate having low SAW velocity, as can be appreciated from the aforesaid equation (1).

Among piezoelectric substrates known to have very limited SAW velocity, there is BGO such as one already referred to in the aforesaid Table 1. A BGO piezoelectric substrate has an SAW velocity of 1,681 m/s. However, the BGO piezoelectric substrate is unsuitable to construct an intermediate-frequency filter for extracting one channel signal alone, because its temperature coefficient of SAW velocity or its TCV is as large as −122 ppm/° C. The reason is that TCV is the quantity indicative of the temperature dependence of SAW velocity as already noted, and that a large TCV value implies that the center frequency of the surface acoustic wave filter varies largely with temperature, as can again be seen from the aforesaid equation (1). Thus, large TCV is unsuitable for an intermediate-frequency filter because undesired signals may possibly be extracted from other channel adjacent to the desired channel.

Among piezoelectric substrates known to have relatively low SAW velocity therm is ST quartz crystal such as one referred to in the aforesaid Table 1. The ST quartz crystal is suitable to construct an intermediate-frequency filter because its temperature coefficient of SAW velocity or its TCV is almost zero (with a primary temperature coefficient a of zero) . For this reason, most of intermediate-frequency surface acoustic wave filters used so far for mobile communication terminal equipment are constructed of ST quartz crystal piezoelectric substrates.

However, the SAW velocity of the ST quartz crystal substrate is 3,158 m/s or is not on a sufficiently reduced level, and so presents some limitation on size reductions.

In addition, the electromechanical coupling factor $k^2$ of the ST quartz crystal is 0.14%, and so is relatively small. Small $k^2$ implies that only a filter having a narrow passband is achievable. Adopted mainly so far for mobile communications, that is, cellular telephones are analog systems with a very narrow channel band width of, for instance, 12.5 kHz according to the Japanese NTT standard, 30 kHz according to the U.S. AMPS standard, and 25 kHz according to the European TACS standard. Thus, the fact that the aforesaid ST quartz crystal has a small electromechanical coupling factor $k^2$ has offered no problem whatsoever. In recent years, however, digital mobile communication systems have been developed, put to practical use, and so rapidly widespread in view of making effective use of frequency resources, compatibility with digital data communications, etc. The channel width of this digital system is very wide, for instance, 200 kHz and 1.7 MHz in the European cellular telephone GSM and cordless telephone DECT modes, respectively. If ST quartz crystal substrates are used for surface acoustic wave filters, it is then difficult to construct such wideband intermediate-frequency filters using them.

DISCLOSURE OF THE INVENTION

As explained above, a problem with a conventional surface acoustic wave device is that when a piezoelectric substrate such as the aforesaid 64 LN, 36 LT or the like is used, it is possible to make its passband wide, but device size becomes large because that substrate has high SAW velocity. Another problem is that when the aforesaid BGO substrate having low SAW velocity is used to achieve device size reductions, good enough selectivity is not obtained due to too large a temperature coefficient of SAW velocity or TCV. In either case, characteristics good-enough for any intermediate-frequency surface acoustic wave filter are unachievable.

The ST quartz crystal substrate having a small temperature coefficient of SAW velocity, TCV, presents some limitation on size reductions due to the fact that its SAW velocity is not sufficiently reduced, and makes it difficult to achieve wide band due to the fact that its electro-mechanical coupling factor $k^2$ is relatively small.

It is an object of the invention to provide a surface acoustic wave device which is of small size, good-enough selectivity, and wide passband.

The aforesaid object is achievable by the invention defined below as (1) to (6).

(1) A surface acoustic wave device comprising an interdigital electrode on a surface of a substrate, wherein:

said substrate is a langasite single crystal belonging to a point group 32, when a cut angle of said substrate cut out of the langasite single crystal and a propagation direction of surface acoustic waves on said substrate are represented in terms of Euler angles ($\phi$, $\theta$, $\psi$), $\phi$, $\theta$, and $\psi$ lie within the following area $\phi0$, and said substrate has a temperature coefficient of SAW velocity, TCV, that is within ±1 ppm/° C.:

Area $\phi0$ $\phi$=−5 to 5° (exclusive of 5°)

$\theta$=136 to 146°

$\psi$=21 to 27°

(2) A surface acoustic wave device comprising an interdigital electrode on a surface of a substrate, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), $\phi$, $\theta$, and $\psi$ lie within the following area $\phi$10-1:

Area $\phi$10-1

$\phi$=5 to 15° (exclusive of 15°)

$\theta$=135 to 180°

$\psi$=30 to 50°

(3) A surface acoustic wave device comprising an interdigital electrode on a surface of a substrate, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), $\phi$, $\theta$, and $\psi$ lie within the following area $\phi$10-2:

Area $\phi$10-2

$\phi$=5 to 15° (exclusive of 15°)

$\theta$=0 to 25°

$\psi$=70 to 90°

(4) A surface acoustic wave device comprising an interdigital electrode on a surface of a substrate, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), $\phi$, $\theta$, and $\psi$ lie within the following area $\phi$20-1:

Area $\phi$20-1

$\phi$=15 to 25° (exclusive of 25°)

$\theta$=135 to 180°

$\psi$=35 to 65°

(5) A surface acoustic wave device comprising an interdigital electrode on a surface of a substrate, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), $\phi$, $\theta$, and $\psi$ lie within the following area $\phi$20-2:

Area $\phi$20-2

$\phi$=15 to 25° (exclusive of 25°)

$\theta$=0 to 25°

$\psi$=60 to 80°

(6) A surface acoustic wave device comprising an interdigital electrode on a surface of a substrate, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), $\phi$, $\theta$, and $\psi$ lie within the following area $\phi$30:

Area $\phi$30

$\phi$=25 to 35° (exclusive of 35°)

$\theta$=150 to 180°

$\psi$=55 to 70°

It is here to be noted that "NUMERICAL AND EXPERIMENTAL INVESTIGATION SAW IN LANGASITE", 1995 IEEE ULTRASONICS SYMPOSIUM, Vol. 1,389 (reference publication 1), for instance, gives a report of numerically calculated SAW velocity, $k^2/2$, TCD (the temperature coefficient of SAW delay time), etc. for langasite single crystal substrates found to be (0°, 30°, 90°)
(0°, 53°, 90°)
(0°, 61°, 0°)
(0°, 147°, 22°)
(0°, 147°, 18°)
(0°, 32°, 40°)
(0°, 156°, 0°)
(0°, $\theta$, 90°)
(0°, 25°, $\psi$)

when the cut angles of the substrates cut out of the langasite single crystal and the propagation direction of surface acoustic waves on the substrates are represented in terms of Euler angles ($\phi$, $\theta$, $\psi$). In this report, TCD profiles of (0°, $\theta$, $\psi$) substrates are depicted in the $\theta\psi$ plane in FIG. 2c. From such TCD profiles it is possible to find TCV profiles. On the other hand, the area $\theta$0 according to the present invention exists within the region depicted in FIG. 2c of that report. However, a region in which TCV found from FIG. 2c of the same report reaches a minimum is in no agreement with the area $\phi$0 defined in the present invention.

Also, "Effects of Electric Field and of Mechanical Pressure on Surface Acoustic Waves Propagation in $La_3Ga_5SiO_{14}$ Piezoelectric Single Crystals", 1995 IEEE ULTRASONICS SYMPOSIUM, Vol. 1,409 (reference publication 2) gives a report of numerically calculated $k^2$ or the like for substrates represented in terms of Euler angles ($\phi$, $\theta$, $\psi$), that is, (90°, 90°, $\psi$)
(0°, 90°, $\psi$)
(0°, 0°, $\psi$)
(0°, $\theta$, 0°)
(90°, $\theta$, 0°)
($\phi$, 90°, 0°)

The aforesaid reference publications 1 and 2 were published in 1996, but their publication dates remain unclear.

An article "A study on SAW propagation characteristics on a langasite crystal plate" in "The 17th Symposium Preprint on the Fundamentals and Applications of Ultrasonic Electronics" (reference publication 3) presents a report of numerically calculated $k^2$, TCD, etc. for substrates represented in terms of Euler angles ($\phi$, $\theta$, $\psi$), viz., (90°, 90°, $\psi$) and of actually found TCD for substrates represented in terms of (0°, 0°, 90°)
(90°, 90°, 175°)
(90°, 90°, 25°)

This reference publication 3 was issued in October, 1996, or after the filing of Japanese Patent Application No. 8-181500 that is a basic application of this application.

An article "Propagation direction dependence of Rayleigh waves on a langasite crystal plate" on page 21 of materials distributed at the 51th Study Meeting in the 150th Committee of Surface Acoustic Wave Device Technology, the Japan Society for the Promotion of Science (reference publication 4) presents a report of numerically calculated $k^2$, etc. for substrates represented in terms of Euler angles ($\phi$, $\theta$, $\psi$), viz., (0°, 0°, $\psi$)
(90°, 90°, $\psi$)

and of TCD calculated from series resonance frequencies actually found for substrates represented in terms of (0°, 0°, 90°)
(90°, 90°, 175°)
(90°, 90°, 15°)
(90°, 90°, 21°)
(90°, 90°, 25°)

This reference publication 4 was issued on Jan. 27, 1997, or after the filing of Japanese Patent Application No. 8-181500 that is a basic application of this application.

An article "Propagation characteristics of surface acoustic waves on $La_3Ga_5SiO_{14}$" in "The 17th Symposium Preprint on the Fundamentals and Applications of Ultrasonic Electronics" (reference publication 5) presents a report of numerically calculated $k^2$, etc. for substrates represented in terms of Euler angles ($\phi$, $\theta$, $\psi$), viz., (90°, 90°, $\psi$)
(0°, 90°, $\psi$)
(0°, 0°, $\psi$)
(0°, $\theta$, 0°)

This reference publication 5 was issued in October, 1996, or after the filing of Japanese Patent Application No. 8-181500 that is a basic application of this application.

SPECIFIC EMBODIMENTS

Figure 1:
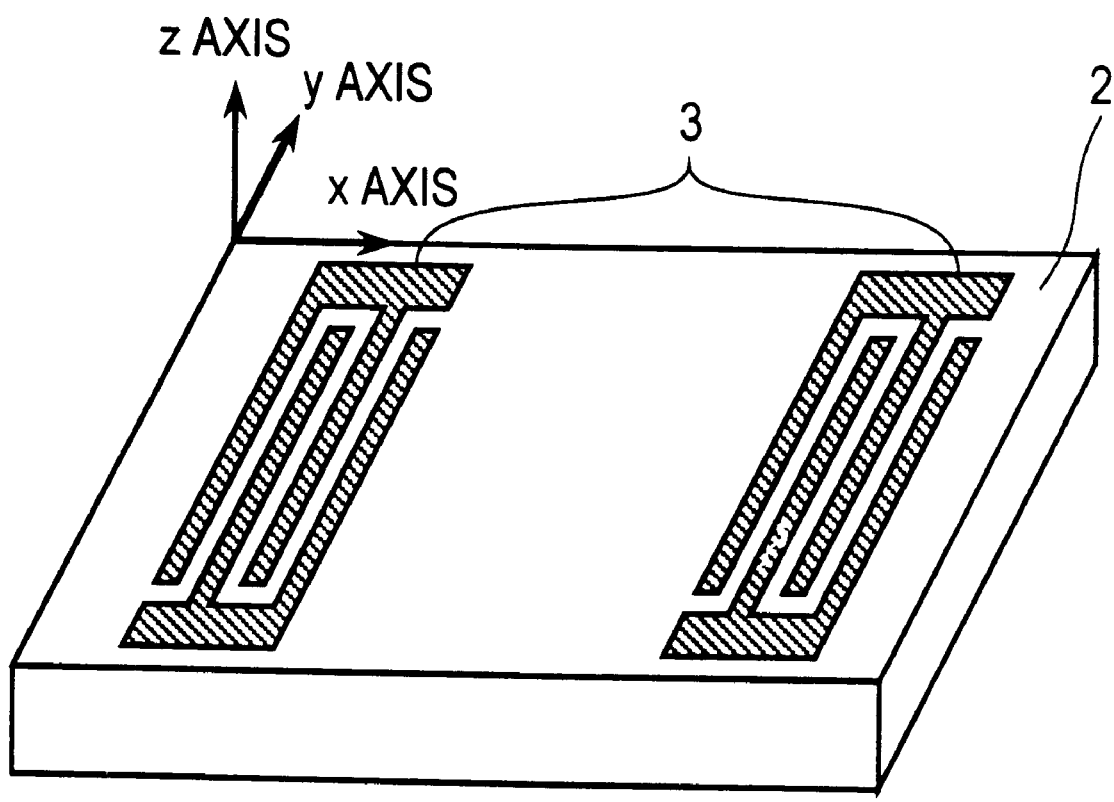
FIG. 1 is a perspective view of a typical embodiment of the surface acoustic wave device according to the present invention.

FIG. 1 illustrates a typical embodiment of the surface acoustic wave device of the present invention. This surface acoustic wave device comprises a set of interdigital electrodes 3 and 3 on a surface of a substrate 2. For the substrate 2 a langasite single crystal is used. The langasite is a crystal type belonging to a point group 32.

In this FIGURE, x, y, and z axes are perpendicular to one another. The x, and y axes lie in a plane direction of the substrate 2, and the x axis defines a propagation direction of surface acoustic waves. The z axis perpendicular to the substrate plane defines a cut angle (cut plane) of the substrate cut out of the single crystal. Relations between these x, y and z axes and X, Y and Z axes of the langasite single crystal may be represented in terms of Euler angles ($\phi$, $\theta$, $\psi$).

When, in the surface acoustic wave device of the present invention, the cut angle and the propagation direction are represented in terms of Euler angles ($\phi$, $\theta$, $\psi$), $\phi$, $\theta$, and $\psi$ exist in the following areas.

Area $\phi$0 is given by $\phi$=−5 to 5° (exclusive of 5°)

$\theta$=136 to 146°

$\psi$=21 to 27°

In the area $\phi$0 there is a combination of $\phi$, $\theta$, and $\psi$ wherein the temperature coefficient of SAW velocity, TCV, of the substrate is very small or lies within ±1 ppm/, and the coupling factor $k^2$ of the substrate is sufficiently large or at least 0.3%.

Area $\phi$10-1 is given by $\phi$=5 to 15° (exclusive of 15°)

$\theta$=135 to 180°

$\psi$=30 to 50°

The area $\phi$10-1 is preferably given by $\phi$=5 to 15° (exclusive of 15°)

$\theta$=135 to 160°

$\psi$=30 to 50°

In the area $\phi$10-1 there is a combination of $\phi$, $\theta$ and $\psi$ wherein the temperature coefficient of SAW velocity, TCV, of the substrate is small or lies within ±30 ppm/° C., and the coupling factor $k^2$ of the substrate is sufficiently large or at least 0.2%. In the aforesaid preferable range within the area $\phi$10-1 there is a combination of $\phi$, $\theta$ and $\psi$ wherein TCV is very small or lies within ±1 ppm/° C. and $k^2$ is sufficiently large or at least 0.3%.

Area $\phi$10-2 is given by $\phi$=5 to 15° (exclusive of 15°)

$\theta$=0 to 25°

$\psi$=70 to 90°

In the area $\phi$10-2 there is a combination of $\phi$, $\theta$ and $\psi$ wherein TCV is very small or lies within ±1 ppm/° C. and $k^2$ is large or at least 0.2%.

Area $\phi$20-1 is given by $\phi$=15 to 25° (exclusive of 25°)

$\theta$=135 to 180°

$\psi$=35 to 65°

The area $\phi$20-1 is preferably given by $\phi$=15 to 25° (exclusive of 25°)

$\theta$=155 to 180°

$\psi$=50 to 60°

More preferably, the area $\phi$20-1 is given by $\phi$=15 to 25° (exclusive of 25°)

$\theta$=155 to 160°

$\psi$=50 to 55°

In the area $\phi$20-1 there is a combination of $\phi$, $\theta$ and $\psi$ wherein the temperature coefficient of SAW velocity, TCV, of the substrate lies within ±80 ppm/° C., and the coupling factor $k^2$ of the substrate is at least 0.1%. In the aforesaid preferable range within the area $\phi$20-1 there is a combination of $\phi$, $\theta$ and $\psi$ wherein TCV is small or lies within ±30 ppm/° C. and $k^2$ is large or at least 0.2%, and in the aforesaid more preferable range within the area $\phi$20-1 there is a combination of $\phi$, $\theta$ and $\psi$ wherein TCV is very small or lies within ±1 ppm/° C. and $k^2$ is sufficiently large or at least 0.3%.

Area $\phi$20-2 is given by $\phi$=15 to 25° (exclusive of 25°)

$\theta$=0 to 25°

$\psi$=60 to 80°

In the area $\phi$20-2 there is a combination of $\phi$, $\theta$ and $\psi$ wherein TCV is small or lies within ±1 ppm/° C. and $k^2$ is large or at least 0.2%.

Area $\phi$30 is given by $\phi$=25 to 35° (exclusive of 35°)

$\theta$=150 to 180°

$\psi$=55 to 70°

The area $\phi$30 is preferably given by $\phi$=25 to 35° (exclusive of 35°)

$\theta$=150 to 160°

$\psi$=65 to 70°

In the area $\phi$30 there is a combination of $\phi$, $\theta$ and $\psi$ wherein the temperature coefficient of SAW velocity, TCV, of the substrate is small or lies within ±30 ppm/° C., and the coupling factor $k^2$ of the substrate is sufficiently large or at least 0.2%. In the aforesaid preferable range within the area $\phi$30 there is a combination of $\phi$, $\theta$ and $\psi$ wherein TCV is very small or lies within ±1 ppm/° C.

The surface acoustic wave velocity is up to 2,900 m/s all over the aforesaid areas on the substrate but, at some points on the substrate, it is up to 2,500 m/s.

It is to be noted that the primary temperature coefficient is herein used as the temperature coefficient of SAW velocity, TCV. Even when a temperature vs. velocity curve takes the form of a quadratic curve (the primary temperature coefficient is zero), the quadratic curve may be approximated to a linear straight line by the method of least square fitting to calculate TCV. Specifically, TCV is found by dividing a change $\Delta v$ of acoustic velocity per unit temperature by acoustic velocity $v_0$ at 0° C.

It is also to be noted that the langasite single crystal is a trigonal system, and so mutually equivalent combinations of Euler angles exist due to crystal symmetry. In the trigonal system substrate, $\phi$=120 to 240°, and $\phi$=240 to 360° (−120 to 0°) is equivalent to $\phi$=0 to 120°; $\theta$=360 to 180° (0 to −180°) is equivalent to $\theta$=0 to 180°; and $\psi$=90 to 270° is equivalent to $\psi$=−90 to 90°. For instance, $\phi$=130°, and $\phi$=250° is equivalent to $\phi$=10°; $\theta$=330° is equivalent to $\theta$=30°; and $\psi$=240° is equivalent to $\psi$=60°.

In the case of the trigonal system substrate, it is also possible to learn characteristics about all cut angles and propagation directions by investigating characteristics in the range of $\phi$=0 to 30°

For the purpose of learning characteristics about all cut angles and propagation directions in the case of the langasite single crystal substrate, therefore, only the following ranges need be investigated.

$\phi_0$=0 to 30°

$\theta_0$=0 to 180°

$\psi$=−90 to 90°

From combinations of such ($\phi_0$, $\theta_0$, $\psi_0$) it is possible to learn equivalent combinations of ($\phi$, $\theta$, $\psi$) that exhibit the same characteristics at $\phi$=30 to 120°. Specifically, ($\phi$, $\theta$, $\psi$) equivalent to ($\phi_0$, $\theta_0$, $\psi_0$) can be determined by $\phi$=60°−$\phi_0$, $\theta$=180°−$\theta_0$ and $\psi$=−$\psi_0$ for the range of 30°≦$\phi$≦60°; $\phi$=60°+$\phi_0$, $\theta$=180°−$\theta_0$ and $\psi$=−$\psi_0$ for the range of 60°≦$\phi$≦90°; and $\phi$=120°−$\phi_0$, $\theta$=$\theta_0$ and $\psi$=$\psi_0$ for the range of 90°≦$\phi$≦120°. Based on the aforesaid symmetry, it is then possible to learn characteristics at all ($\phi$, $\theta$, $\psi$).

Set out below are typical equivalent combinations.

Equivalent to (10°, 160°, 40°) are
(50°, 20°, 40°)
(70°, 20°, −40°)
(110°, 160°, −40°)
Equivalent to (0°, 140°, 25°) are
(60°, 40°, 25°)
(60°, 40°, −25°)
(120°, 140°, −25°)
(120°, 140°, 25°)
(0°, 140°, −25°), too, is equivalent thereto because φ=120° is equivalent to φ=0°.

Each of the aforesaid areas specified in the present invention is understood to embrace the thus determined equivalent (φ, θ, ψ) combinations.

The langasite single crystal used in the present invention is generally represented by a chemical formula $La_3Ga_5SiO_{14}$, and known from Proc. IEEE International Frequency Control Sympo. vol. 1994, pp. 48–57(1994) as an example. In the present invention, the langasite single crystal is applied to a surface acoustic wave device substrate. If, in this case, the cut direction of crystal and the propagation direction of surface acoustic waves are specifically selected, it is then possible to achieve a surface acoustic wave device having such high characteristics as mentioned above. Langasite single crystals, if they are found by x-ray diffraction to be mainly composed of a langasite phase alone, may be used herein. In other words, the langasite single crystals used herein are not always limited to that represented by the aforesaid chemical formula. For instance, at least one part of each site for La, Ga, and Si may have been substituted by other element, or the number of oxygen may depart from the aforesaid stoichiometric composition. In addition, the langasite single crystals may contain inevitable impurities such as Al, Zr, Fe, Ce, Nd, Pt, and Ca. No particular limitation is imposed on how tD produce the langasite single crystals; that is, they may be produced by ordinary single crystal growth methods, for instance, the CZ method.

Substrate size is not particularly critical, and may generally be of the order of 4 to 10 mm in the propagation direction of surface acoustic waves and of the order of 2 to 4 mm in a direction perpendicular thereto, and substrate thickness may be of the order of 0.2 to 0.4 mm.

It is to be noted that the cut direction of the substrate is ascertainable by x-ray diffraction.

Each of the interdigital electrodes 3 formed on the substrate 2 is a periodically striped thin film electrode for exciting, receiving, reflecting, and propagating surface acoustic waves. The interdigital electrode is patterned so as to achieve the aforesaid preselected propagation direction of surface acoustic waves. The interdigital electrode may be formed as by evaporation or sputtering, using Au or Al. The finger width of the interdigital electrode may be determined depending on the frequency to which the surface acoustic wave device is applied, and may generally be of the order of 2 to 15 μm at the frequency band to which the present invention is preferably applied.

The surface acoustic wave device of the present invention lends itself well to filters used at a frequency band of 10 to 500 MHz in general, and 10 to 300 MHz in particular. The surface acoustic wave device of the present invention is useful for making a surface acoustic wave delay element small as well, because of its slow SAW velocity.

EXAMPLES

The present invention will now be explained with reference to examples.

A langasite single crystal A was grown by the CZ method, and a substrate was cut out of this single crystal. A surface acoustic wave transducer comprising a set of inter-digital electrodes was formed on the surface of the substrate to fabricate a surface acoustic wave device. The inter-digital electrodes were formed on both output and input sides of Al by evaporation, and had a thickness of 0.3 μm, an electrode finger width d of 12 μm and an electrode pitch (4d) of 48 μm, with the number of electrode finger pairs being 20. A plurality of such devices were fabricated with varying cut angles of the substrate and varying propagation directions of surface acoustic waves. Another langasite single crystal B was grown by the CZ method, and a substrate was cut out of this single crystal. In otherwise similar manners as in the case of the single crystal A, a plurality of devices were fabricated.

Table 2 shows the values of Euler angles (φ, θ, ψ) in terms of which the cut angle of the substrate and the propagation direction of surface acoustic waves in these devices are represented.

These devices were measured for the SAW velocity, and electromechanical coupling factor $k^2$. The SAW velocity was found from the center frequency of the filter, and the electromechanical coupling factor $k^2$ was determined from a two-terminal admittance measured of the surface acoustic wave transducer, using a well-known Smith's equivalent circuit model. Further, the temperature coefficient of SAW velocity, TCV, was determined in the range of −40 to 80° C. The results are collectively shown in Table 2.

TABLE 2

| Area | Single Crystal | φ(°) | θ(°) | ψ(°) | SAW Velocity (m/s) | $K^2$(%) | TCV (ppm/° C.) |
|---|---|---|---|---|---|---|---|
| φ0 | B | 0 | 140 | 25 | 2742 | 0.31 | 0 |
| φ0 | B | 0 | 145 | −25 | 2753 | 0.35 | 0 |
| φ10-1 | A | 10 | 160 | 40 | 2761 | 0.40 | −5 |
| φ10-1 | B | 10 | 155 | 35 | 2809 | 0.37 | 1 |
| φ10-2 | A | 10 | 15 | 75 | 2800 | 0.26 | 0 |
| φ10-2 | B | 10 | 20 | 75 | 2869 | 0.20 | 0 |
| φ20-1 | A | 20 | 165 | 50 | 2766 | 0.39 | 0 |
| φ20-1 | B | 20 | 155 | 50 | 2833 | 0.30 | −4 |
| φ20-2 | A | 20 | 15 | 70 | 2819 | 0.31 | 0 |
| φ20-2 | B | 20 | 20 | 70 | 2890 | 0.29 | −5 |
| φ30 | A | 30 | 160 | 60 | 2849 | 0.39 | −8 |
| φ30 | B | 30 | 155 | 65 | 2826 | 0.24 | −1 |

As can be seen from Table 2, it is found that if the cut angle of the substrate cut out of the crystal and the propagation direction of surface acoustic waves come within the scope of the present invention, it is then possible to achieve TCV having a small absolute value as mentioned above, sufficiently large $k^2$, and low SAW velocity.

EFFECTS

According to the present invention, the cut angle of the substrate cut out of the langasite single crystal and the propagation direction of surface acoustic waves on the substrate are optimized. This makes it possible to achieve a surface acoustic wave device comprising a substrate having a temperature coefficient of SAW velocity, TCV, the absolute value of which is small, a large electromechanical coupling factor $k^2$, and low SAW velocity. It is thus possible to achieve a filter device which is improved in terms of temperature stability, has a wide passband, and is reduced in size, especially an intermediate-frequency surface acoustic wave filter having improved characteristics best-fitted for mobile communication terminal equipment.

What is claimed is:

1. A surface acoustic wave device comprising:
   a substrate comprising a langasite single crystal; and
   an interdigital electrode formed on said substrate,
   wherein said langasite single crystal belongs to a point group 32,
   an x axis and a y axis, perpendicular to said x axis, lie in a plane of said substrate, where x defines a propagation direction of surface acoustic waves,
   a z axis defines a direction perpendicular to the plane of said substrate,
   X, Y, and Z axes define axes of said langasite single crystal, and
   a relation between the x, y, z axes and the X, Y, Z axes is represented by Euler angles $\phi$, $\theta$, and $\psi$, where:
   $5° \leq \phi < 15°$,
   $0° \leq \theta \leq 25°$, and
   $70° \leq \psi \leq 90°$.

2. A surface acoustic wave device comprising:
   a substrate comprising a langasite single crystal; and
   an interdigital electrode formed on said substrate,
   wherein said langasite single crystal belongs to a point group 32,
   an x axis and a y axis, perpendicular to said x axis, lie in a plane of said substrate, where x defines a propagation direction of surface acoustic waves,
   a z axis defines a direction perpendicular to the plane of said substrate,
   X, Y, and Z axes define axes of said langasite single crystal, and
   a relation between the x, y, z axes and the X, Y, Z axes is represented by Euler angles $\phi$, $\theta$, and $\psi$, where:
   $15° \leq \phi < 25°$,
   $135° \leq \theta \leq 180°$, and
   $35° \leq \psi \leq 65°$.

3. A surface acoustic wave device comprising:
   a substrate comprising a langasite single crystal; and
   an interdigital electrode formed on said substrate,
   wherein said langasite single crystal belongs to a point group 32,
   an x axis and a y axis, perpendicular to said x axis, lie in a plane of said substrate, where x defines a propagation direction of surface acoustic waves,
   a z axis defines a direction perpendicular to the plane of said substrate,
   X, Y, and Z axes define axes of said langasite single crystal, and
   a relation between the x, y, z axes and the X, Y, Z axes is represented by Euler angles $\phi$, $\theta$, and $\psi$, where:
   $15° \leq \phi < 25°$,
   $0° \leq \theta \leq 25°$, and
   $60° \leq \psi \leq 80°$.

4. A surface acoustic wave device comprising:
   a substrate comprising a langasite single crystal; and
   an interdigital electrode formed on said substrate,
   wherein said langasite single crystal belongs to a point group 32,
   an x axis and a y axis, perpendicular to said x axis, lie in a plane of said substrate, where x defines a propagation direction of surface acoustic waves,
   a z axis defines a direction perpendicular to the plane of said substrate,
   X, Y, and Z axes define axes of said langasite single crystal, and
   a relation between the x, y, z axes and the X, Y, Z axes is represented by Euler angles $\phi$, $\theta$, and $\psi$, where:
   $25° \leq \phi < 35°$,
   $150° \leq \theta \leq 180°$, and
   $55° \leq \psi \leq 70°$.

* * * * *